United States Patent
Heragu et al.

(10) Patent No.: US 7,719,332 B2
(45) Date of Patent: May 18, 2010

(54) GLITCH REDUCED DELAY LOCK LOOP CIRCUITS AND METHODS FOR USING SUCH

(75) Inventors: Keerthinarayan P. Heragu, Richardson, TX (US); Padattil K. Nisha, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 55 days.

(21) Appl. No.: 11/832,021

(22) Filed: Aug. 1, 2007

(65) Prior Publication Data

US 2009/0033385 A1    Feb. 5, 2009

(51) Int. Cl.
*H03L 7/06* (2006.01)
(52) U.S. Cl. ............ 327/158; 327/149; 327/153; 327/161; 327/270; 327/271; 327/273; 327/276; 327/277; 327/279; 327/284; 327/286
(58) Field of Classification Search ........... 327/149, 327/153, 158, 161, 261, 265, 269–271, 273, 327/276, 277, 279, 284, 286
See application file for complete search history.

(56) References Cited

U.S. PATENT DOCUMENTS

| | | | | |
|---|---|---|---|---|
| 6,342,796 B2 * | 1/2002 | Jung | | 327/141 |
| 6,731,147 B2 * | 5/2004 | Fiscus | | 327/158 |
| 6,801,072 B2 * | 10/2004 | Guinea et al. | | 327/277 |
| 7,218,158 B2 * | 5/2007 | Kim | | 327/158 |
| 7,489,169 B2 * | 2/2009 | Kim | | 327/158 |
| 2002/0043996 A1 * | 4/2002 | Iwamoto | | 327/158 |
| 2003/0184355 A1 * | 10/2003 | Lee | | 327/158 |
| 2005/0242855 A1 * | 11/2005 | Lee | | 327/158 |
| 2006/0044033 A1 * | 3/2006 | Kim | | 327/158 |
| 2009/0033386 A1 * | 2/2009 | Nisha et al. | | 327/158 |
| 2009/0033387 A1 * | 2/2009 | Heragu et al. | | 327/158 |
| 2009/0033388 A1 * | 2/2009 | Heragu et al. | | 327/158 |

OTHER PUBLICATIONS

U.S. Appl. No. 11/832,030, filed Aug. 1, 2007, Nisha.
U.S. Appl. No. 11/832,036, filed Aug. 1, 2007, Heragu.
U.S. Appl. No. 11/832,045, filed Aug. 1, 2007, Heragu.

* cited by examiner

*Primary Examiner*—Lincoln Donovan
*Assistant Examiner*—Patrick O'Neill
(74) *Attorney, Agent, or Firm*—Dawn V. Stephens; Wade James Brady, III; Frederick J. Telecky, Jr.

(57) ABSTRACT

Delay lock loop circuits are described, which may include two or more delay stages that each includes a plurality of selectable delay elements. A reference signal drives an input of the first delay stage, which provides a first output. The first output drives an input of the second delay stage, which provides a second output. The circuits further include a first selector register that is associated with the first delay stage. A value maintained in the first selector register determines a number of the selectable delay elements utilized in the first delay stage. The circuits further include a second selector register associated with the second delay stage. A value maintained in the second selector register determines a number of the selectable delay elements utilized in the second delay stage. Modification of the values maintained in the first and second selector registers are synchronized to the first and second outputs, respectively.

6 Claims, 6 Drawing Sheets

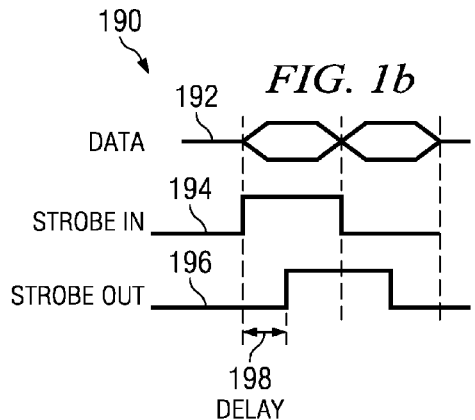
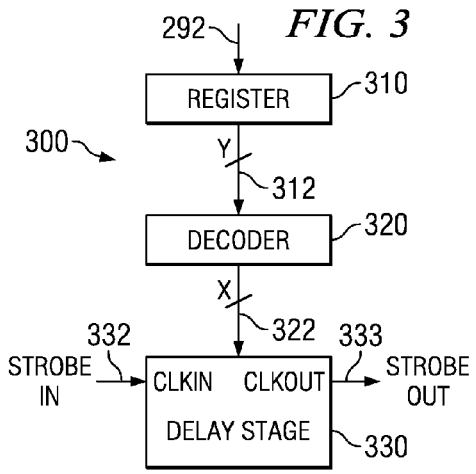
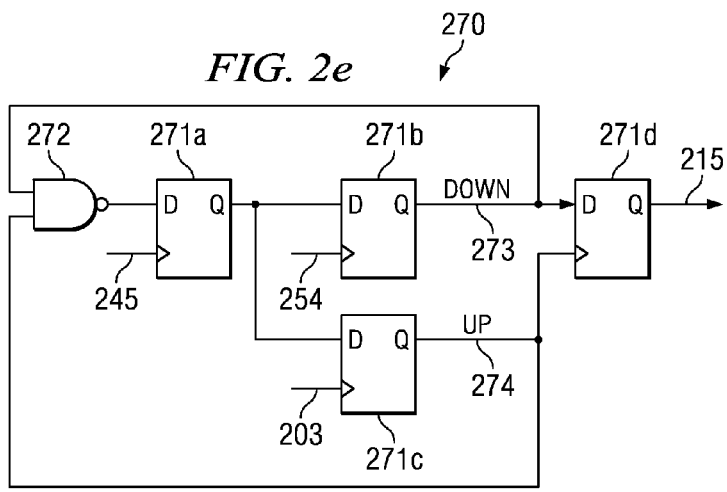
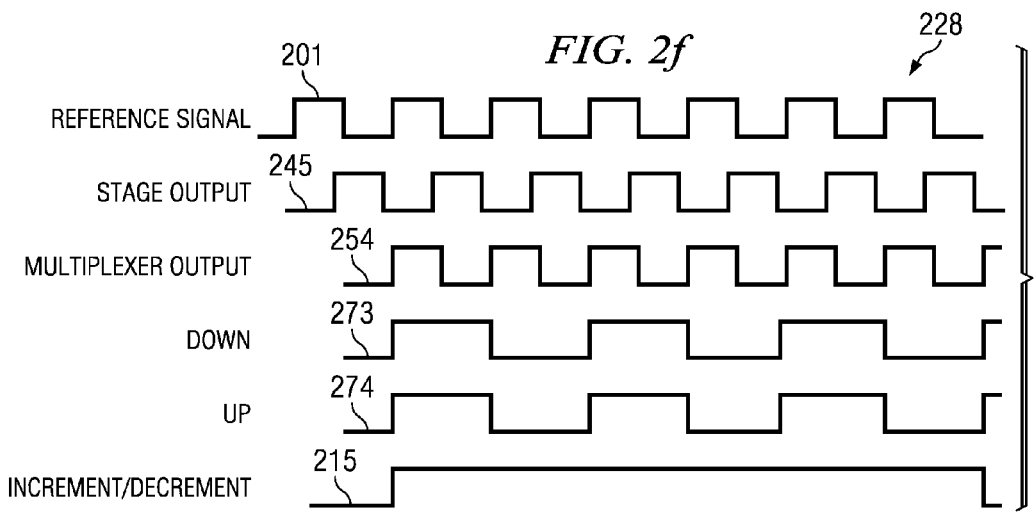

GLITCH REDUCED DELAY LOCK LOOP CIRCUITS AND METHODS FOR USING SUCH

BACKGROUND OF THE INVENTION

The present invention is related to event synchronization, and more particularly to systems and methods for synchronizing one signal to another signal in a semiconductor device.

Synchronizing one electrical signal to another often involves applying the signal to a data input of a flip-flop, and clocking the flip-flop using a clock to which the signal is to be synchronized. The signal to be synchronized generally must be applied to the data input of the flip-flop for a defined period before the clock transitions (i.e., setup time), and must remain for a defined period after the clock transitions (i.e., hold time). By assuring that the setup and hold times are met, predictable circuit operation is achieved.

In some cases, a delay lock loop circuit has been used to delay a signal in relation to a synchronizing clock to assure that setup and hold times are met. Such delay lock loops may be iteratively updated until a desired delay is achieved. Various implementations of delay lock loop circuits, however, may incur clock glitches when an iterative update is occurring. Such glitches can at time lead to circuit errors.

Thus, for at least the aforementioned reasons, there exists a need in the art for advanced systems and devices for signal synchronization.

BRIEF SUMMARY OF THE INVENTION

The present invention is related to event synchronization, and more particularly to systems and methods for synchronizing one signal to another signal in a semiconductor device.

Various embodiments of the present invention provide delay lock loop circuits. Such delay lock loop circuits include two or more delay stages that each include a plurality of selectable delay elements. A reference signal drives an input of the first delay stage, and the first delay stage provides a first output. The first output drives an input of the second delay stage, and the second delay stage provides a second output. The circuits further include a first selector register that is associated with the first delay stage. A value maintained in the first selector register determines a number of the selectable delay elements utilized in the first delay stage. Modification of the value maintained in the first selector register is synchronized to the first output. The circuits further include a second selector register associated with the second delay stage. A value maintained in the second selector register determines a number of the selectable delay elements utilized in the second delay stage. Modification of the value maintained in the second selector register is synchronized to the second output. In some instances of the aforementioned embodiments, the value maintained in the first selector register is the same as the value maintained in the second selector register. In various instances of the aforementioned embodiments, modification of one or both of the first selector register and the second selector register is enabled once per a determined number of cycles of the reference signal. In one particular case, the determined number of cycles is six.

Some instances of the aforementioned embodiments include a total of five delay stages that each includes the plurality of selectable delay elements, and each provides a stage output and is associated with a respective selector register. The selector registers are each synchronized to the output of the respective stage with which the selector register is associated. In some cases, distinct enables are respectively associated with each of the selector registers. In such cases, the circuits further include a counter circuit that is synchronized to the reference signal. The output of the counter circuit is asserted once per the determined number of cycles of the reference signal. The circuits further include five enable circuits—the five enable circuits being associated respective ones of the five selector registers. The enable circuit associated with the first selector register maintains the output of the counter circuit synchronous to the first output, and provides an enable signal to the first selector register; the enable circuit associated with the second selector register registers the output of the counter circuit synchronous to the reference signal to create an interim signal, then registers the interim signal synchronous to the second output to provide an enable signal to the second selector register; the enable circuit associated with the third selector register registers the output of the first enable circuit synchronous to the third output, and provides an enable signal to the third selector register; the enable circuit associated with the fourth selector register registers the output of the second enable circuit synchronous to the fourth output, and provides an enable signal to the fourth selector register; and the enable circuit associated with the fifth selector register registers the output of the third enable circuit synchronous to the fifth output, and provides an enable signal to the fifth selector register.

In various instances of the aforementioned embodiments, the circuits further include a feedback loop. The reference signal and at least one of the first output, the second output, the third output, the fourth output and the fifth output are provided as inputs to the feedback loop. The feedback loop is operable to determine the value maintained in the different selector registers associated with the delay stages. In some cases, the feedback loop includes an increment/decrement circuit that is operable to modify the value in the first selector register based on a comparison of the reference signal with the at least one of the first output, the second output, the third output, the fourth output and the fifth output.

In some instances of the aforementioned embodiments, the delay stages are substantially identical including the same number of delay elements. In various instances of the aforementioned embodiments, the plurality of delay elements may be a plurality of single input buffers, a plurality of multiple input logic gates, combinations of the aforementioned, and/or the like.

Other embodiments of the present invention provide methods for glitch reduction in a delay lock loop circuit. Such methods include providing a delay lock loop circuit that includes at least a first delay stage and a second delay stage. The first delay stage provides a first output and the second delay stage provides a second output. The delay lock loop circuit includes a first selector register associated with the first delay stage and a second selector register associated with the second delay stage. A value maintained in the first selector register determines a number of selectable delay elements that are utilized in the first delay stage, and a value maintained in the second selector register determines a number of selectable delay elements that are utilized in the second delay stage. The methods further include modifying the value maintained in the first selector register synchronous to the first output, and modifying the value maintained in the second selector register synchronous to the second output.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 1b depicts a strobe signal delayed in relation to a data signal;

FIGS. 2a-2f show a delay lock loop circuit including glitch reduction circuitry in accordance with some embodiments of the present invention; and FIG. 3 depicts a slave delay stage along with an interface circuit to the slave delay stage that may be implemented in relation to various embodiments of the present invention.

DETAILED DESCRIPTION OF THE INVENTION

The present invention is related to event synchronization, and more particularly to systems and methods for synchronizing one signal to another signal in a semiconductor device.

Various embodiments of the present invention provide delay lock loop circuits and methods for using such. As one example, a delay lock loop circuit is provided that includes at least a first delay stage and a second delay stage. As used herein, the phrase "delay stage" is used in its broadest sense to mean any combination of circuitry that is capable of delaying one signal relative to another. Thus, for example, a delay stage may receive a reference signal and provide a derivative of the reference signal that is shifted in time by a particular delay. Each of the aforementioned delay stages includes a plurality of selectable delay elements. As used herein, the phrase "plurality of selectable delay elements" is used in its broadest sense to mean two or more delay introducing circuits or circuit elements that each may be selected into a set of delay elements that together provide a particular delay.

The delay stages may be configured such that a reference signal drives an input of the first delay stage, and a first output from the first delay stage drives an input of the second delay stage. The circuits further include selectors registers that are each associated with a respective delay stage. As used herein, the phrase "selector register" is used in its broadest sense to mean any storage circuit that is capable of maintaining a value. In a particular instance, the value maintained in one of the selector registers determines a number of the selectable delay elements utilized in the first delay stage, and the value maintained in another selector register determined the number of the selectable delay elements utilized in the second delay stage. In operation of the aforementioned circuits, modification of the value maintained in the selector registers is synchronized to an output of the delay stage with which the respective selector register is associated.

Figure 1A:
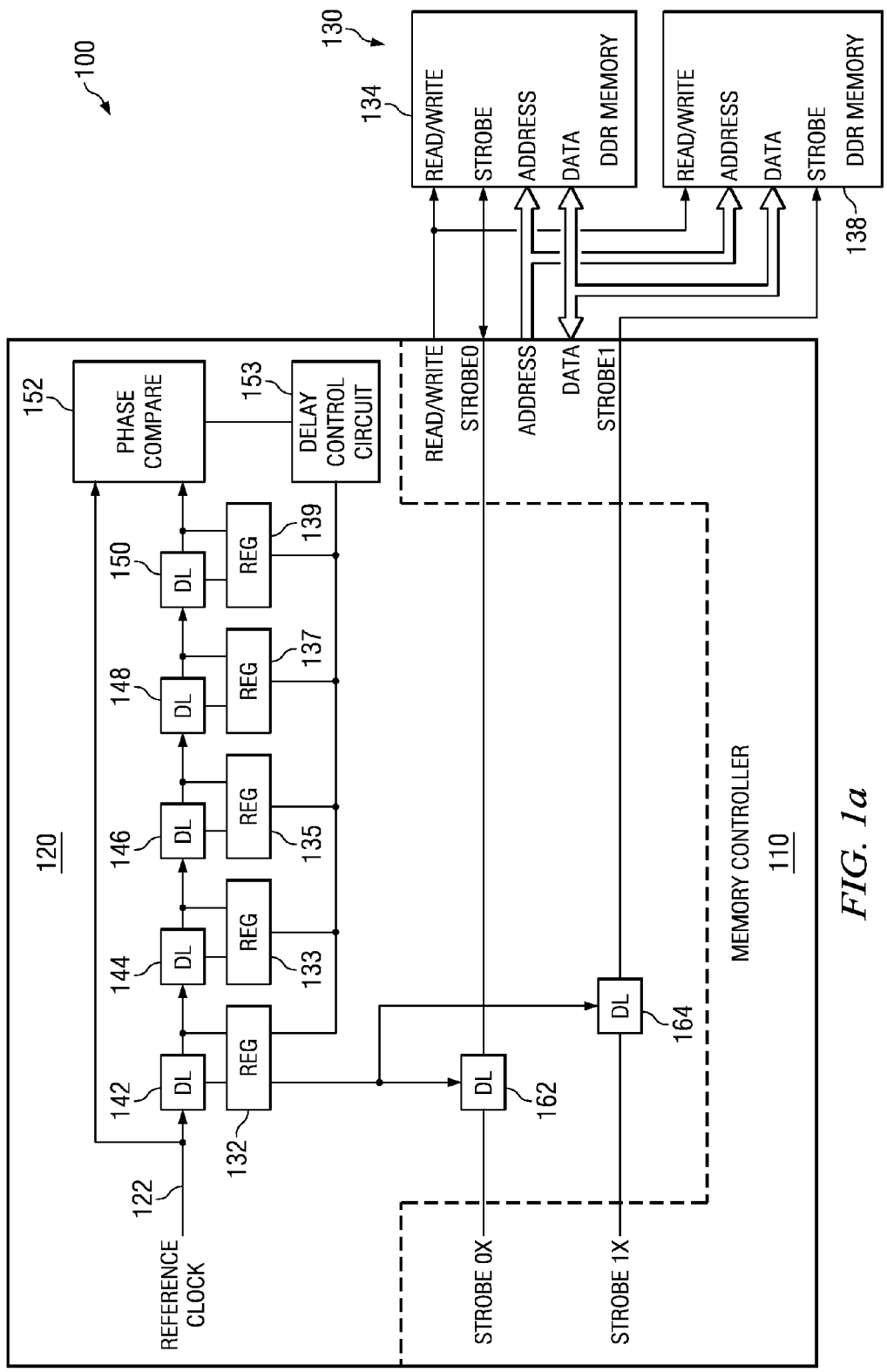
FIG. 1a shows a memory system that utilizes a combination memory controller and delay lock loop circuit in accordance with one or more embodiments of the present invention.

Turning to FIG. 1a, a memory system 100 is shown that utilizes a combination memory controller 110 and a delay lock loop circuit 120 in accordance with one or more embodiments of the present invention. It should be noted that delay lock loop circuit 120 may be implemented on the same semiconductor die as memory controller 110, or may be implemented on a different die. Further, it should be noted that delay lock loop circuit 120 may be integrated with memory controller 110 or may be implemented as separate modules of the same circuit design. As shown, memory controller 110 includes a number of signals that are generated to allow access to one or more memory modules. Generation of such signals may be accomplished in various ways as are known in the art. For example, the same strobe signal may be used for both read and write signals, or a strobe signal for the read and a strobe signal for the write may be created internal to memory controller 110 and only at the interface of memory controller 110 are the two signals combined to drive the strobe I/O of the external memory. As shown, memory system 100 includes a bank 130 of double data rate memory blocks 134, 138. It should be noted that other memory types may be used in accordance with different embodiments of the present invention. Each of memory blocks 134, 138 includes an interface consisting of an address bus, a data bus, a strobe and a read/write control line. In operation, when data is to be written to memory block 134, the appropriate address is applied to the address bus, the read/write control line is asserted to indicate a write operation, data is placed on the data bus, and the strobe signal for memory block 134 (i.e., strobe 0) is asserted. The same process is done to write data to memory block 138, except that the strobe signal for memory block 138 (i.e., strobe 1) is asserted. In contrast, when data is to be read from memory block 134, the appropriate address is applied to the address bus, the read/write control line is asserted to indicate a read operation. Memory block 134 then asserts the strobe associated memory block 134 (i.e., strobe 0) coincident with applying data to the data bus. The same process is used for reading data from memory block 138, except that the strobe associated with memory block 138 is asserted. Based on the disclosure provided herein, one of ordinary skill in the art will recognize a variety of interfaces or signal sets that may be used in accordance with different embodiments of the present invention.

In some cases, the strobe and the data are not properly aligned during the read and write cycles. In such cases, delay lock loop circuit 120 may be used to delay one or more strobe signals to create the appropriate alignment. As shown, a delay stage 162 is used to delay the strobe associated with memory block 134, and a delay stage 164 is used to delay the strobe associated with memory block 138. It should be noted that depending upon the configuration, delay stage 162 may be designed to delay a strobe received from memory block 134 by a particular amount, or delay stage 162 may be designed to delay a strobe provided to memory block 134 from memory controller 110. Similarly, depending upon the configuration, delay stage 164 may be designed to delay a strobe received from memory block 138 by a particular amount, or delay stage 164 may be designed to delay a strobe provided to memory block 138 from memory controller 110. The amount of delay applied by delay stage 162 and delay stage 164 is controlled by delay lock loop circuit 120. It should be noted that delay lock loop circuit 120 may be implemented in relation to a circuit other than a memory controller. Based on the disclosure provided herein, one of ordinary skill in the art will recognize a variety of applications that may benefit from use of such a delay lock loop circuit.

The aforementioned process of delaying strobes using delay stages 162, 164 is graphically displayed in FIG. 1b. Turning to FIG. 1b, a timing diagram 190 shows data 192 applied to the aforementioned data bus and a corresponding strobe in 194. As shown, strobe in 194 transitions coincident with the change in data 192. In some cases such an immediate transition results in a setup or hold problem in either memory blocks 134, 138 or a device receiving data from memory blocks 134, 138. By introducing a controlled time delay 198 to strobe in 194, any setup or hold problems may be averted. As more fully discussed below, time delay 198 is programmable by selecting a different number of delay elements implemented as part of delay stages 162, 164.

The number of delay elements utilized in delay stages 162, 164 is determined through delay locking to a reference clock 122 using delay lock loop circuit 120. Delay lock loop circuit 120 includes a delay stage 142, a delay stage 144, a delay stage 146, a delay stage 148 and a delay stage 150. In some instances, all of delay stages 142, 144, 146, 148, 150 are substantially identical including the same number of delay elements. As shown, reference clock 122 is an input to delay stage 142, the output of delay stage 142 is the input of delay stage 144, the output of delay stage 144 is the input of delay stage 146, the output of delay stage 146 is the input of delay stage 148, and the output of delay stage 148 is the input of delay stage 150. The number of delay elements utilized in delay stage 142 is determined by a value maintained in a selector register 132; the number of delay elements utilized in delay stage 144 is determined by a value maintained in a selector register 133; the number of delay elements utilized in delay stage 146 is determined by a value maintained in a selector register 135; the number of delay elements utilized in delay stage 148 is determined by a value maintained in a selector register 137; and the number of delay elements utilized in delay stage 150 is determined by a value maintained in a selector register 139.

The output of delay stage 150 (or in some cases, an output of one of the other delay stages 142, 144, 146, 148) is compared with reference clock 122 by a phase comparator 152. The output of phase comparator 152 indicates whether the number of delay elements currently utilized in each of delay stages 142, 144, 146, 148, 150 is to be incremented, decremented or left constant in order to achieve the desired delay lock. In particular, phase comparator 152 provides an increment/decrement signal 153 to a delay control circuit 154. Based on increment/decrement signal 153, delay control circuit 154 controls the value maintained in each of selector registers 132, 133, 135, 137, 139, and thereby controls the number of delay elements used by each of delay stages 142, 144, 146, 148, 150. In some cases, the same number of delay elements are utilized in each of delay stages 162, 164. In other cases, the number of delay elements that are utilized by delay stages 162, 164 is mathematically related to that determined by delay control circuit 154. In either case, the number of delay elements used in each of delay stages 142, 144, 146, 148, 150 to achieve a desired delay lock condition corresponds to the number of delay elements utilized in delay stages 162, 164.

As just one of many examples, delay lock loop circuit 120 may be configured such that it locks when the output of delay stage 150 is phase delayed three hundred and sixty degrees from reference clock 122. In such a case, the delay introduced by delay stages 162, 164 may be a time corresponding to the aforementioned ninety degree phase delay. Alternatively, the delay introduced by delay stages 162, 164 may be a multiple of or a division of the time corresponding to the aforementioned ninety degree phase delay. Such a multiple or division of the time may be accomplished, for example, by shifting a binary value representing the number of utilized delay elements either right or left. It should be noted that phase delays other than ninety degrees may be achieved using one or more embodiments of the present invention. For example, a delay lock loop circuit may be configured to yield a seventy-two degree phase delay. As yet another example, a delay unrelated to phase shift, but rather an absolute time may be achieved. Based on the disclosure provided herein, one of ordinary skill in the art will recognize various delays that may be implemented using one or more embodiments of the present invention.

Turning to FIGS. 2a-2f, a delay lock loop circuit 200 including glitch reduction circuitry in accordance with some embodiments of the present invention is depicted. Delay lock loop circuit 200 includes a set of delay stages 242, 244, 246, 248, 250. Each of delay stages 242, 244, 246, 248, 250 includes a plurality of selectable delay elements and a selector register. The selector register maintains a value that is used to select the number of selectable delay elements that are used in forming a particular delay implemented by the delay stage. Delay stage 242 provides a stage output 243, delay stage 244 provides a stage output 245, delay stage 246 provides a stage output 247, delay stage 248 provides a stage output 249, and delay stage 250 provides a stage output 251. A reference input 201 is provided as an input to delay stage 242, stage output 243 is provided as an input to delay stage 244, stage output 245 is provided as an input to delay stage 246, stage output 247 is provided as an input to delay stage 248, and stage output 249 is provided as an input to delay stage 250.

Further, delay lock loop circuit 200 includes a feedback loop that includes a phase comparator 210, an enable generator 220, and a unified selector register 230. Delay lock loop circuit 200 also includes a reference signal gate 202, and a phase selector multiplexer 252. In one particular embodiment of the present invention, each of the aforementioned delay stages is designed to implement a phase delay of about seventy-two degrees. In such cases, phase selector multiplexer 252 provides an ability to select between a one stage seventy-two degree phase shift or a one stage ninety degree phase shift depending upon whether a selector input 253 is set such that phase selector multiplexer 252 causes stage output 249 or stage output 251 to drive a multiplexer output 254. Based on the disclosure provided herein, one of ordinary skill in the art will recognize a variety of embodiments that do not employ a multiplexer 252, or that employ additional multiplexers to allow for selection of different stage outputs.

Reference signal 201, stage output 245, and one of stage output 249 or stage output 251 are provided to an up/down generator 216 of phase comparator 210. Up/down generator 216 provides an output to an increment generator 214 that indicates whether a number of delay elements used in each of delay stages 242, 244, 246, 248, 250 should be incremented, decremented or maintained constant to achieve the desired phase shift. Increment generator 214 provides an output to a lock generator 212 that provides a lock output 213 that is asserted whenever delay lock loop circuit 200 is operating at or near a desired delay.

In addition, increment generator 214 provides an increment/decrement signal 215 to each of the selector registers implemented as part of delay stages 242, 244, 246, 248, 250. Depending upon the assertion level of increment/decrement signal 215, the value maintained in the respective selector registers is increased or decreased. This increase or decrease in the value maintained in the respective selector registers causes a corresponding increase or decrease in the amount of delay incurred when a signal is passed through the associated delay stage.

A selector register enable circuit 230 provides a group of selector register enable signals 231 that are distributed to each of the respective delay stages 242, 244, 246, 248, 250. The selector registers implemented as part of delay stages are each enabled by one of selector register enable signals 231 that is synchronized to an output from the particular delay stage. In this way, glitches are avoided when the value of the respective selector registers are updated.

An X-bit value 278 from one of the aforementioned selector registers is provided to an encoder 280. X-bit selector value 278 is the same value that selects the number of the delay elements in each of delay stages 242, 244, 246, 248, 250 that are used in a delay chain implemented by the respective delay stage. In one particular embodiment of the present invention, X-bit selector register is sixty-three bits wide, and the number of selectable delay elements in each of delay stages 242, 244, 246, 248, 250 is also sixty-three. It should be noted that the aforementioned delay width and register width is related to a particular implementation. It should also be noted that in contrast to the preceding example, the width of the selector registers implemented as part of delay stages 242, 244, 246, 248, 250 230 need not necessarily match the number of delay elements implemented in each of delay stages 242, 244, 246, 248, 250. Further, it should be noted that each of delay stages 242, 244, 246, 248, 250 do not necessarily need to include the same number of delay elements. Based on the disclosure provided herein, one of ordinary skill in the art will recognize a number of different delay widths and register widths that may be used in accordance with different embodiments of the present invention.

X-bit value 278 may be used to select a number of delay elements of one or more slave delay stages (not shown). In such cases, X-bit value 278 may be encoded using an encoder 280 that yields an encoded Y-bit value 282. This may be used to limit the width of an output bus used to transfer X-bit value 278 to the slave delay stages. Encoded Y-bit value 282 may be registered using a register 290, and a register output 292 is provided to the associated slave delay stages. Based on the disclosure provided herein, one of ordinary skill in the art will recognize a variety of other circuits that may be used to transfer X-bit value 278 to slave delay stages depending upon particular design constraints.

Figure 2A:
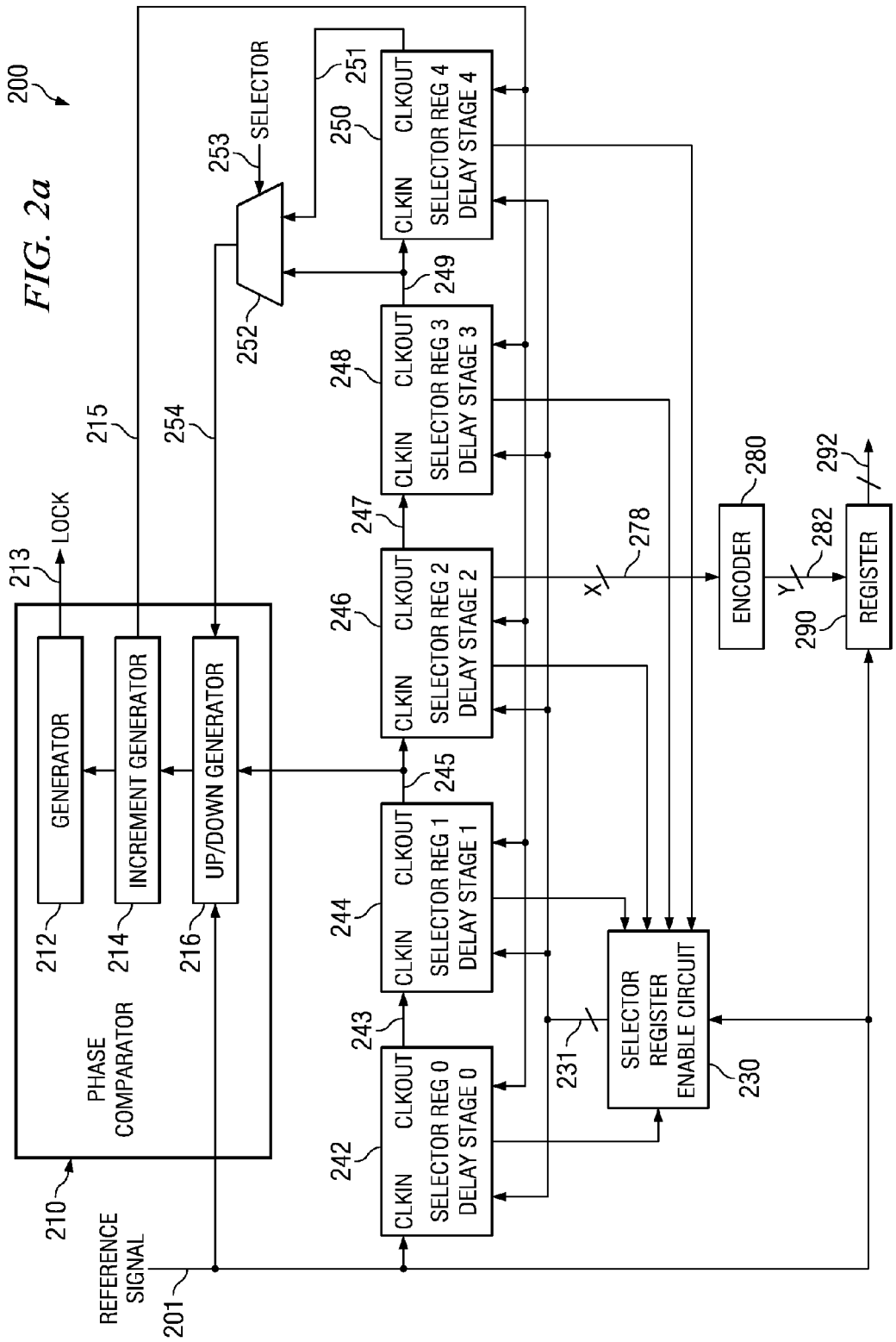
Figure 2B:
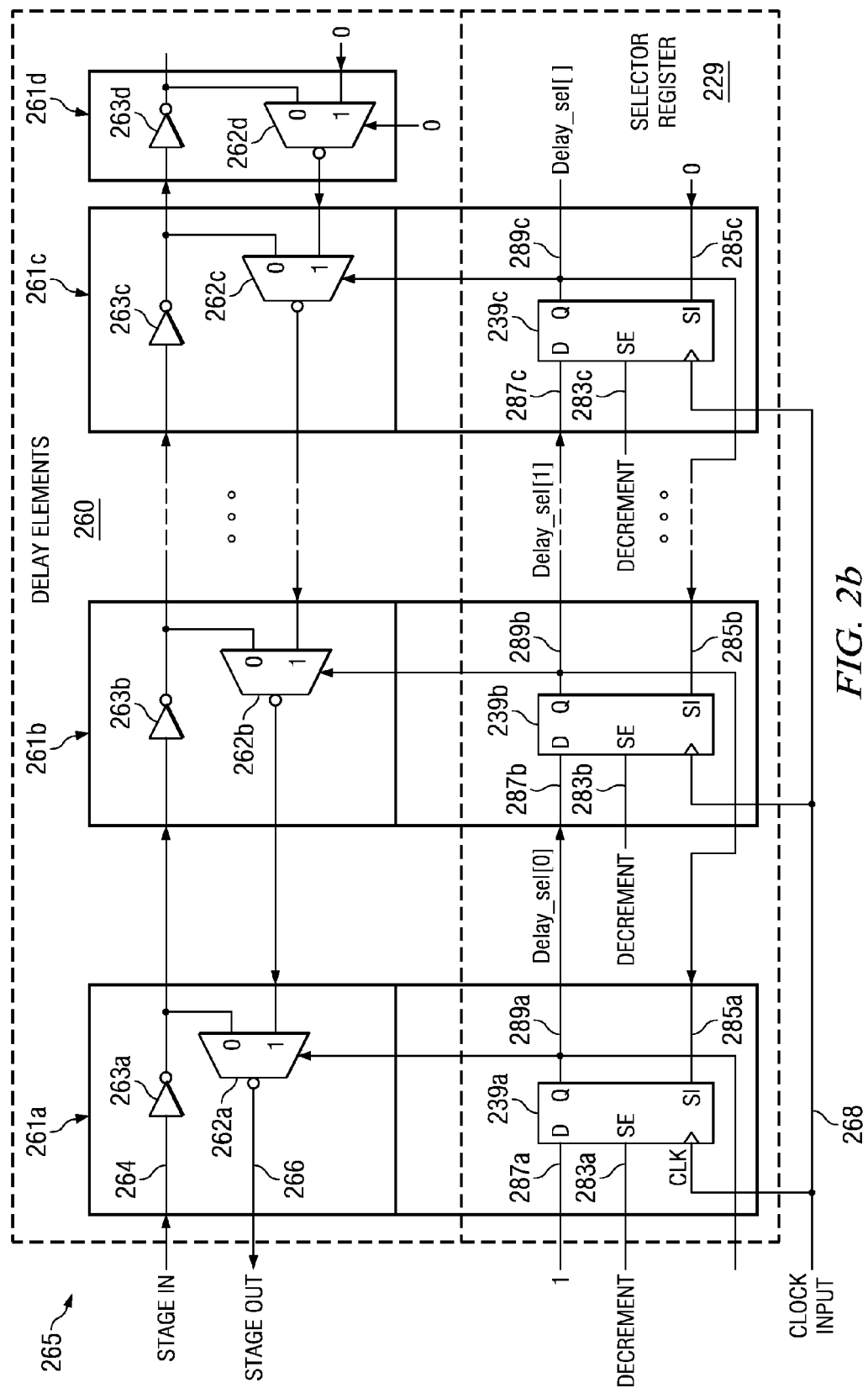

Turning to FIG. 2b, a detailed schematic of one implementation of a delay stage 265 is provided. As shown, delay stage 265 includes a set of delay elements 260 and a selector register 229. Delay stage 265 may be used in place of any or all of delay stages 242, 244, 246, 248, 250 discussed above in relation to FIG. 2a. As shown, delay stage 265 includes a number of delay elements 261 that can be configured as a chain of delay elements including as many as one delay element up to the total number of delay elements. The number of delay elements used depends upon the value maintained in selector register 229. Delay stage 265 receives a stage input 264 and provides a stage output 266. As an example, where delay stage 265 is used in place of delay stage 242, stage input 264 corresponds to reference signal 201 and stage output 266 corresponds to stage output 243. The increment input to selector register 229 corresponds to increment/decrement signal 215.

Each delay element 261 includes a delay buffer 263 that may be, but is not limited to an inverting buffer, a logic gate, or a non-inverting buffer. Based on the disclosure provided herein, one of ordinary skill in the art will recognize a variety of circuits that may be used to cause a signal delay. In addition, each delay element 261 includes a multiplexer 262 that is controlled by an input from selector register 231 and is used to control whether the signal is turned around at the particular delay element in delay stage 265. In particular, when the value provided from selector register 231 is a logic '1', the signal will not turn around, and in turn will select the signal from the next delay element. In contrast, when the value provided from selector register 231 is a logic '0', the signal turns around at that delay element. As each delay element 261 drives a subsequent delay element 261 (i.e., the output of delay element 261d, drives the output of delay element 261c), the value provided from selector register 231 includes a series of logic '1's followed by a series of logic '0's, with the transition between logic '0's and logic '1's being positioned such that it corresponds to the overall delay line length implemented in delay stage 265.

Selector register 229 is implemented as a shift register that causes a series of logic '1's followed by a series of logic '0's to shift right whenever the delay implemented by delay stage 261 is to be increased, and to shift left whenever the delay implemented by delay stage 261 is to be decreased. In particular, selector register 229 includes a number of flip-flops 239 configured in series. Each of flip-flops 239 includes a shift enable input 283, a scan input 285, a data input 287 and an output 289. In operation, when a shift right is to occur, an increment signal input (e.g., increment/decrement signal 215) is asserted high, and upon the next assertion of a clock input 268 (e.g., one of enable signals 231 associated with delay stage 265 gated with stage output 265 discussed below in relation to FIG. 2c) the block of logic '1's followed by the block of logic '0's shifts right. In contrast, when a shift left is to occur, the increment signal input (e.g., increment/decrement signal 215) is asserted low, and upon the next assertion of a clock input (e.g., one of enable signals 231 associated with delay stage 265 gated with stage output 265 discussed below in relation to FIG. 2c) the block of logic '1's followed by the block of logic '0's shifts left. Based on the disclosure provided herein, one of ordinary skill in the art will recognize other designs for implementing selector register 229.

Figure 2C:
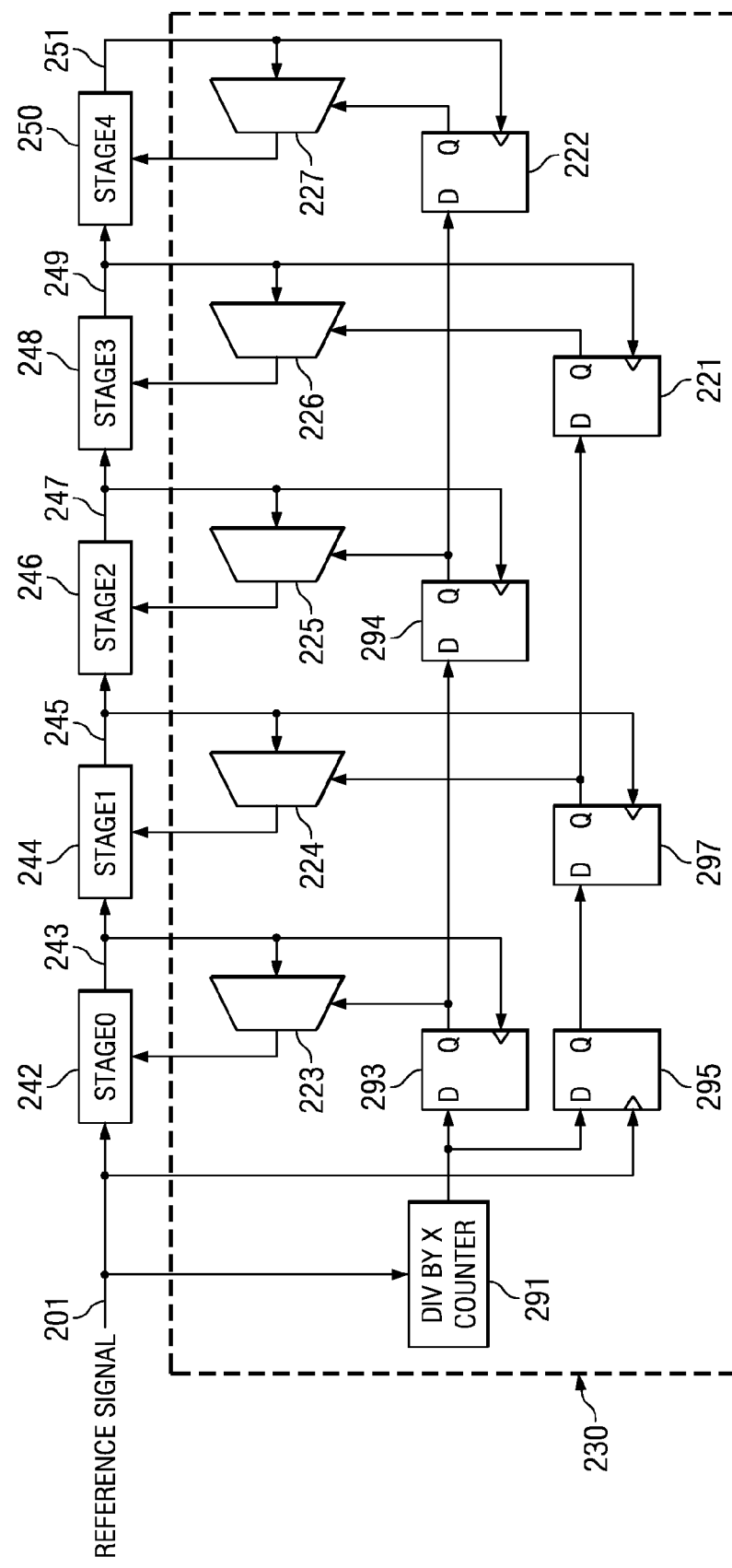

Turning to FIG. 2c, a detailed diagram of selector register enable circuit 230 is shown in relation to delay stages 242, 244, 246, 248, 250. As shown, selector register enable circuit 230 includes a counter 291 that asserts each time a particular number of cycles of reference signal 201 have been received. In one particular embodiment of the present invention, counter 291 is designed such that its output asserts each time six cycles of reference signal 201 have been received.

The output of counter 291 is applied to the data input of a flip-flop 293 where it is registered synchronous to stage output 243 (i.e., stage output 243 is applied to the clock input of flip-flop 293). The output of flip-flop 293 is provided to delay stage 242 via a clock gate 223. Clock gate 223 operates to gate stage output 243 with the output of flip-flop 293, with the output of clock gate 223 being used as the clock input to the selector register associated with delay stage 242. This effectively synchronizes the clock used to update the selector register associated with delay stage 242 to the output created by the same delay stage. In this way, glitches occurring in delay stage 242 that are associated with an update of the selector register are reduced or eliminated.

A similar approach is applied to the creation of other enables 231 applied to other selector registers by selector register enable circuit 230. In particular, the output of counter 291 is registered synchronous to reference signal 201 using a flip-flop 295, and the output of register 295 is again registered using a flip-flop 297 synchronous to stage output 245. The output of flip-flop 297 is provided to delay stage 244 via a clock gate 224. Clock gate 224 operates to gate stage output 245 with the output of flip-flop 297, with the output of clock gate 224 being used as the clock input to the selector register associated with delay stage 244. This effectively synchronizes the clock used to update the selector register associated with delay stage 244 to the output created by the same delay stage. The output of flip-flop 293 is registered by flip-flop 299 synchronous to stage output 247. The output of flip-flop 299 is provided to delay stage 246 via a clock gate 225. Clock gate 225 operates to gate stage output 247 with the output of flip-flop 299, with the output of clock gate 225 being used as the clock input to the selector register associated with delay stage 246. This effectively synchronizes the clock used to update the selector register associated with delay stage 246 to the output created by the same delay stage. The output of flip-flop 299 is registered by flip-flop 222 synchronous to stage output 251. The output of flip-flop 222 is provided to delay stage 250 via a clock gate 227. Clock gate 227 operates to gate stage output 251 with the output of flip-flop 222, with the output of clock gate 227 being used as the clock input to the selector register associated with delay stage 250. This effectively synchronizes the clock used to update the selector register associated with delay stage 250 to the output created by the same delay stage. The output of flip-flop 297 is registered by flip-flop 221 synchronous to stage output 249. The output of flip-flop 221 is provided to delay stage 248 via a clock gate 226. Clock gate 226 operates to gate stage output 249 with the output of flip-flop 221, with the output of clock gate 226 being used as the clock input to the selector register associated with delay stage 248. This effectively synchronizes the clock used to update the selector register associated with delay stage 248 to the output created by the same delay stage. A glitch may occur because a multiplexer selecting between one input or another is switched while the newly selected input or the currently selected input is changing. By synchronizing an update of the selector register with a signal synchronous to the output of the delay stage with which the synchronizing register is associated any such glitching may be reduced or eliminated.

Figure 2D:
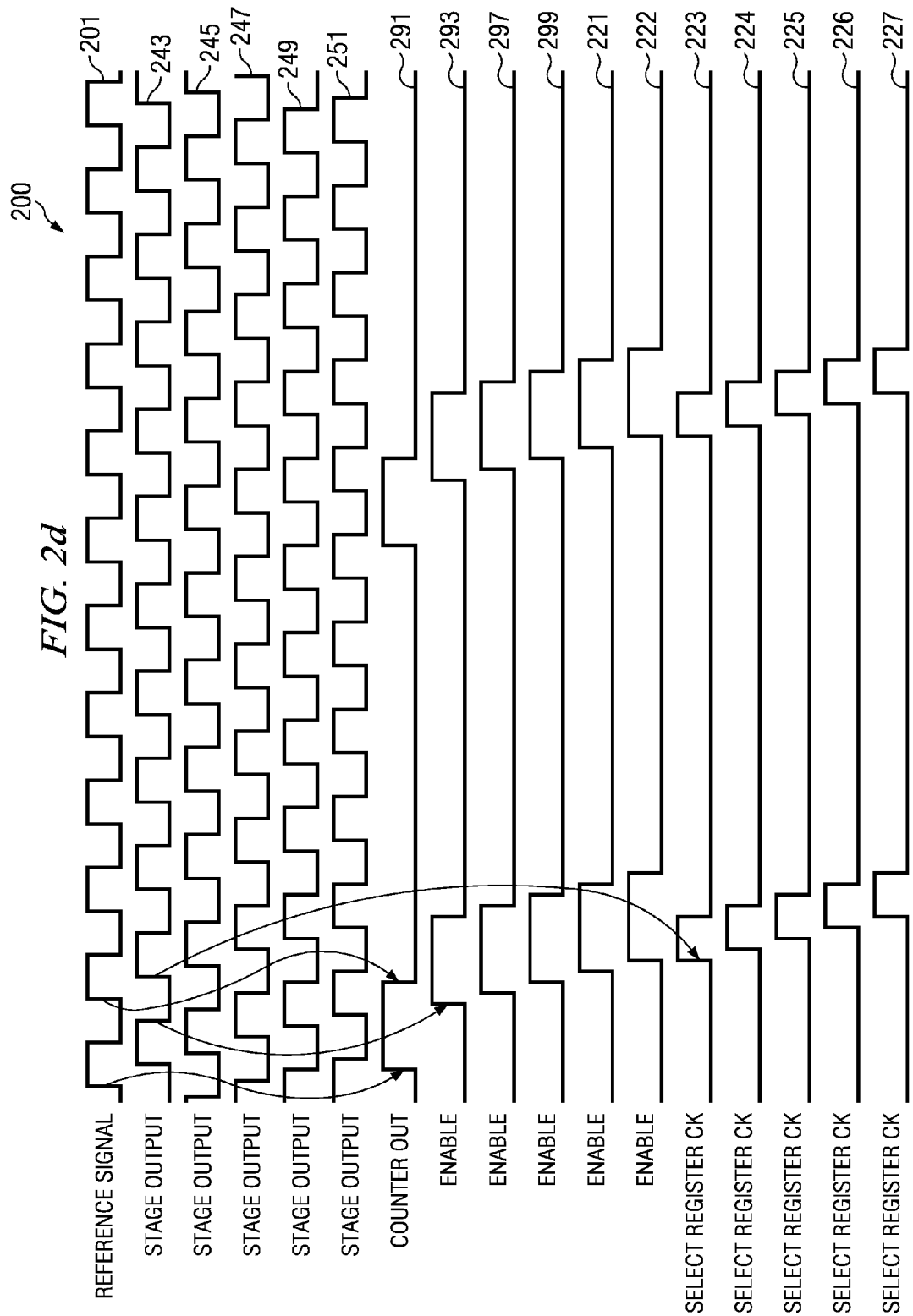

Turning to FIG. 2d, a timing diagram 204 shows the relationship of reference signal 201 with the various stage outputs, enable signals, and selector register clocks. In particular, stage output 243 is shown as a delayed version of reference signal 201, with the delay corresponding to the number of delay elements utilized in delay stage 242. Stage output 245 is shown as a delayed version of stage output 243, with the delay corresponding to the number of delay elements utilized in delay stage 244. Stage output 247 is shown as a delayed version of stage output 245, with the delay corresponding to the number of delay elements utilized in delay stage 246. Stage output 249 is shown as a delayed version of stage output 247, with the delay corresponding to the number of delay elements utilized in delay stage 248. Stage output 251 is shown as a delayed version of stage output 249, with the delay corresponding to the number of delay elements utilized in delay stage 250.

The output of counter 291 is shown as asserting once for every six cycles of reference signal 201. The output of counter 291 is registered as enable 293 (i.e., the output of flip-flop 293) upon the falling edge of stage output 243. This signal is then gated with stage output 243 to create the clock input of the select register associated with delay stage 242. The clocks provided to the other delay stages are similarly generated.

Turning to FIG. 2e, an exemplary up/down and increment generator circuit 270 that may be used in relation to one or more embodiments of the present invention is depicted. Up/down and increment generator circuit 270 may be used in place of up/down generator 216 and increment generator 214 discussed above in relation to FIG. 2a. Up/down and increment generator circuit 270 includes a number of flip-flops 271 that are each clocked using different outputs and inputs from delay stages 242, 244, 246, 248, 250. In particular, a flip-flop 271a is clocked by stage output 245, a flip-flop 271b is clocked by multiplexer output 254 that is either stage output 249 or stage output 251, and a flip-flop 271c is clocked by gated reference signal 203. A flip-flop 271d is clocked by the output of flip-flop 271c. The data input of both flip-flop 271b and flip-flop 271c are connected to the output of flip-flop 271a. The output of flip-flop 271b (i.e., a down signal 273) and the output of flip-flop 271c (i.e., an up signal 274) are applied as inputs to a NAND gate 272, and the output of NAND gate 272 is applied to the input of flip-flop 271a. The output of flip-flop 271b is also applied to the input of flip-flop 271d. The output of flip-flop 271d is increment/decrement signal 215.

Operation of up/down and increment generator circuit 270 is described in relation to a timing diagram 228 of FIG. 2f. As shown, reference signal 201 is passed through delay stage 242 and delay stage 244 to create stage output 245. Multiplexer output 254 is reference signal 201 after it has been passed through delay stage 242, delay stage 244, delay stage 246, delay stage 248 and in some cases delay stage 250 depending upon the assertion of selector input as discussed above in relation to FIG. 2a. As shown, up signal 274 and down signal 273 are originally asserted at a logic '0'. Upon the next positive transition of multiplexer output 254, the output of flip-flop 271a transitions to a logic '1'. Then, upon the next positive transition of reference signal 201, up signal 274 transitions to a logic '1', and upon the next positive transition of multiplexer output 254, down signal 273 transitions to a logic '1'. Where up signal 274 transitions before down signal 273, increment/decrement signal 215 is asserted as a logic '0'. In contrast, where up signal 274 transitions after down signal 273, increment/decrement signal 215 is asserted as a logic '1'. In this way, a signal indicating whether the value in selector register 230 may be incremented or decremented based on a comparison of a phase shifted version of a reference clock with the reference clock. It should be noted that up/down and increment generator circuit 270 is merely exemplary, and that one of ordinary skill in the art will recognize other up/down circuits that may be used in relation to various embodiments of the present invention.

Turning to FIG. 3, a slave delay stage 330 along with an interface circuit 300 that may be implemented in relation to various embodiments of the present invention is depicted. Interface circuit 300 includes a register 310 that registers register output 292 from delay lock loop 200 depicted in FIG. 2a. A Y-bit output 312 from register 310 is passed through decoder 320 that decodes it to create an X-bit output 322. In some cases, X-bit output 322 is the same as X-bit output 232 discussed above. X-bit output 322 is applied to delay stage 330 where it is used to select the number of delay elements that are utilized in delay stage 330 to strobe in 332 to create strobe 333. In some cases, delay stage 330 is identical to delay stages 242, 244, 246, 248, 250. In other cases, delay stage 330 includes fewer or more delay elements than that included in delay stages 242, 244, 246, 248, 250 and applying X-bit output 322 may cause the selection of a predictable, but different delay than that produced by delay stages 242, 244, 246, 248, 250. For example, delay stage 330 may include twice as many delay elements and each bit of X-bit output 322 may correspond to two delay elements making the delay produced by delay stage 330 twice that of any of delay stages 242, 244, 246, 248, 250. Based on the disclosure provided herein, one of ordinary skill in the art will appreciate various designs that may be employed to generate a delay in delay stage 330 relative to the corresponding delay in delay stages 242, 244, 246, 248, 250.

In conclusion, the present invention provides novel systems, devices, methods for signal synchronization. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A delay lock loop circuit, the circuit comprising:
at least a first delay stage and a second delay stage, wherein each of the first delay stage and the second delay stage includes a plurality of selectable delay elements, wherein a reference signal drives an input of the first delay stage, wherein the first delay stage provides a first output, wherein the first output drives an input of the second delay stage, and wherein the second delay stage provides a second output;
a first selector register associated with the first delay stage, wherein a value maintained in the first selector register determines a number of the selectable delay elements utilized in the first delay stage, and wherein modification of the value maintained in the first selector register is synchronized to the first output; and
a second selector register associated with the second delay stage, wherein
a value maintained in the second selector register determines a number of the selectable delay elements utilized in the second delay stage, and wherein
modification of the value maintained in the second selector register is synchronized to the second output,
the value maintained in the first selector register is the same as the value maintained in the second selector register;
modifying the value maintained in the first selector register is enabled once per a determined number of cycles of the reference signal, and wherein
the circuit further comprises:
a third delay stage, a fourth delay stage and a fifth delay stage, wherein each of the third delay stage, the fourth delay stage and the fifth delay stage includes the plurality of selectable delay elements, wherein the second output drives an input of the third delay stage, wherein the third delay stage provides a third output, wherein the third output drives an input of the fourth delay stage, wherein the fourth delay stage provides a fourth output, wherein the fourth output drives an input of the fifth delay stage, and wherein the fifth delay stage provides a fifth output;
a third selector register associated with the third delay stage, wherein a value maintained in the third selector register determines a number of the selectable delay elements utilized in the third delay stage, and wherein modification of the value maintained in the third selector register is synchronized to the third output;
a fourth selector register associated with the fourth delay stage, wherein a value maintained in the fourth selector register determines a number of the selectable delay elements utilized in the fourth delay stage, and wherein modification of the value maintained in the fourth selector register is synchronized to the fourth output; and
a fifth selector register associated with the fifth delay stage, wherein a value maintained in the fifth selector register determines a number of the selectable delay elements utilized in the fifth delay stage, and wherein modification of the value maintained in the fifth selector register is synchronized to the fifth output, and
wherein modification of the value maintained in the first selector register is enabled by a first enable signal, wherein modification of the value maintained in the second selector register is enabled by a second enable signal, wherein modification of the value maintained in the third selector register is enabled by a third enable signal, wherein modification of the value maintained in the fourth selector register is enabled by a fourth enable signal, wherein modification of the value maintained in the fifth selector register is enabled by a fifth enable signal, and wherein the circuit further comprises:
a counter circuit, wherein the counter circuit is synchronized to the reference signal, and wherein an output of the counter circuit is asserted once per the determined number of cycles of the reference signal;
a first enable circuit, wherein the first enable circuit registers the output of the counter circuit synchronous to the first output, and wherein an output of the first enable circuit is the first enable signal;
a third enable circuit, wherein the third enable circuit registers the first enable signal synchronous to the third output, and wherein an output of the third enable circuit is the third enable signal;
a fifth enable circuit, wherein the fifth enable circuit registers the third enable signal synchronous to the fifth output, and wherein an output of the fifth enable circuit is the fifth enable signal;
a second enable circuit, wherein the second enable circuit registers the output of the counter circuit synchronous to the reference signal to create an interim signal, wherein the second enable circuit registers the interim signal synchronous to the second output, and wherein an output of the second enable circuit is the second enable signal; and
a fourth enable circuit, wherein the fourth enable circuit registers the second enable signal synchronous to the fourth output, and wherein an output of the fourth enable circuit is the fourth enable signal.

2. A delay lock loop circuit the circuit comprising:
at least a first delay stage and a second delay stage, wherein each of the first delay stage and the second delay stage includes a plurality of selectable delay elements, wherein a reference signal drives an input of the first delay stage, wherein the first delay stage provides a first output, wherein the first output drives an input of the second delay stage, and wherein the second delay stage provides a second output;
a first selector register associated with the first delay stage, wherein a value maintained in the first selector register determines a number of the selectable delay elements utilized in the first delay stage, and wherein modification of the value maintained in the first selector register is synchronized to the first output; and
a second selector register associated with the second delay stage, wherein
a value maintained in the second selector register determines a number of the selectable delay elements utilized in the second delay stage, and
modification of the value maintained in the second selector register is synchronized to the second output,
wherein modification of the value maintained in the first selector register is enabled by a first enable signal, wherein modification of the value maintained in the second selector register is enabled by a second enable signal, and wherein the circuit further comprises:
a counter circuit, wherein the counter circuit is synchronized to the reference signal, and wherein an output of the counter circuit is asserted once per the determined number of cycles of the reference signal;

a first enable circuit, wherein the first enable circuit registers the output of the counter circuit synchronous to the first output, and wherein an output of the first enable circuit is the first enable signal; and a second enable circuit, wherein the second enable circuit registers the output of the counter circuit synchronous to the reference signal to create an interim signal, wherein the second enable circuit registers the interim signal synchronous to the second output, and wherein an output of the second enable circuit is the second enable signal.

3. The circuit of claim 2, wherein the circuit further comprises:

a feedback loop, wherein the reference signal and at least one of the first output, the second output, a third output, a fourth output and a fifth output are provided as inputs to the feedback loop; and wherein the feedback loop is operable to determine the value maintained in the first selector register, the value maintained in the second selector register, a value maintained in a third selector register, a value maintained in a fourth selector register, and a value maintained in a fifth selector register.

4. The circuit of claim 3, wherein the feedback loop includes an increment/decrement circuit, and wherein the increment/decrement circuit is operable to modify the value in the first selector register based on a comparison of the reference signal with the at least one of the first output, the second output, the third output, the fourth output and the fifth output.

5. The circuit of claim 2, wherein the first delay stage and the second delay stage are substantially identical.

6. The circuit of claim 2, wherein the plurality of delay elements is selected from a group consisting of: a plurality of single input buffers, and a plurality of multiple input logic gates.

* * * * *